United States Patent
Wang et al.

(10) Patent No.: US 8,198,125 B2
(45) Date of Patent: Jun. 12, 2012

(54) METHOD OF MAKING MONOLITHIC PHOTOVOLTAIC MODULE ON FLEXIBLE SUBSTRATE

(75) Inventors: Chiou-Fu Wang, Yonghe (TW); Huo-Hsien Chiang, Taipei (TW)

(73) Assignee: Du Pont Apollo Limited, Pak Shek Kok, N.T. (HK)

( * ) Notice: Subject to any disclaimer, the term of this patent is extended or adjusted under 35 U.S.C. 154(b) by 0 days.

(21) Appl. No.: 12/963,251

(22) Filed: Dec. 8, 2010

(65) Prior Publication Data

US 2011/0143496 A1   Jun. 16, 2011

Related U.S. Application Data

(60) Provisional application No. 61/285,724, filed on Dec. 11, 2009.

(51) Int. Cl.
*H01L 31/18* (2006.01)
*H01L 31/048* (2006.01)
*H01L 31/0248* (2006.01)

(52) U.S. Cl. ......... 438/96; 438/57; 438/97; 438/80; 438/754; 257/E21.219; 257/E31.002; 257/E31.047; 257/E31.124

(58) Field of Classification Search .......... 257/E27.123–E27.126, E31.002–E31.008, E21.219, E31.047, 257/E31.124; 438/95–97, 57, 80, 754; 977/773; 136/244, 249, 252, 256, 258, 262; 252/79.1, 252/79.2, 79.4; 216/13

See application file for complete search history.

(56) References Cited

U.S. PATENT DOCUMENTS

| | | | |
|---|---|---|---|
| 5,688,366 A | 11/1997 | Ichinose et al. | |
| 2009/0095706 A1* | 4/2009 | Hauch et al. | 216/13 |
| 2009/0320916 A1* | 12/2009 | Yuan et al. | 136/256 |
| 2010/0059098 A1* | 3/2010 | Beernink et al. | 136/244 |
| 2010/0065119 A1* | 3/2010 | Marsan et al. | 136/256 |
| 2010/0068890 A1* | 3/2010 | Stockum et al. | 438/754 |
| 2010/0323471 A1* | 12/2010 | Le et al. | 438/96 |

* cited by examiner

*Primary Examiner* — Hsien Ming Lee
*Assistant Examiner* — Walter H Swanson

(57) ABSTRACT

A method of making a monolithic photovoltaic module having a flexible substrate is described. The method includes the following steps. First, a flexible substrate is provided, and a first adhesive layer, a metal layer, and a second adhesive layer are formed thereon. The second adhesive layer, the metal layer and the first adhesive layer are etched with at least one etching paste. In addition, a patterned semiconductor body layer patterned by an etching paste or a laser scribing is formed thereon. Furthermore, transparent top electrodes patterned by an etching paste or a cold laser scribing are formed on the patterned semiconductor body layer.

18 Claims, 1 Drawing Sheet

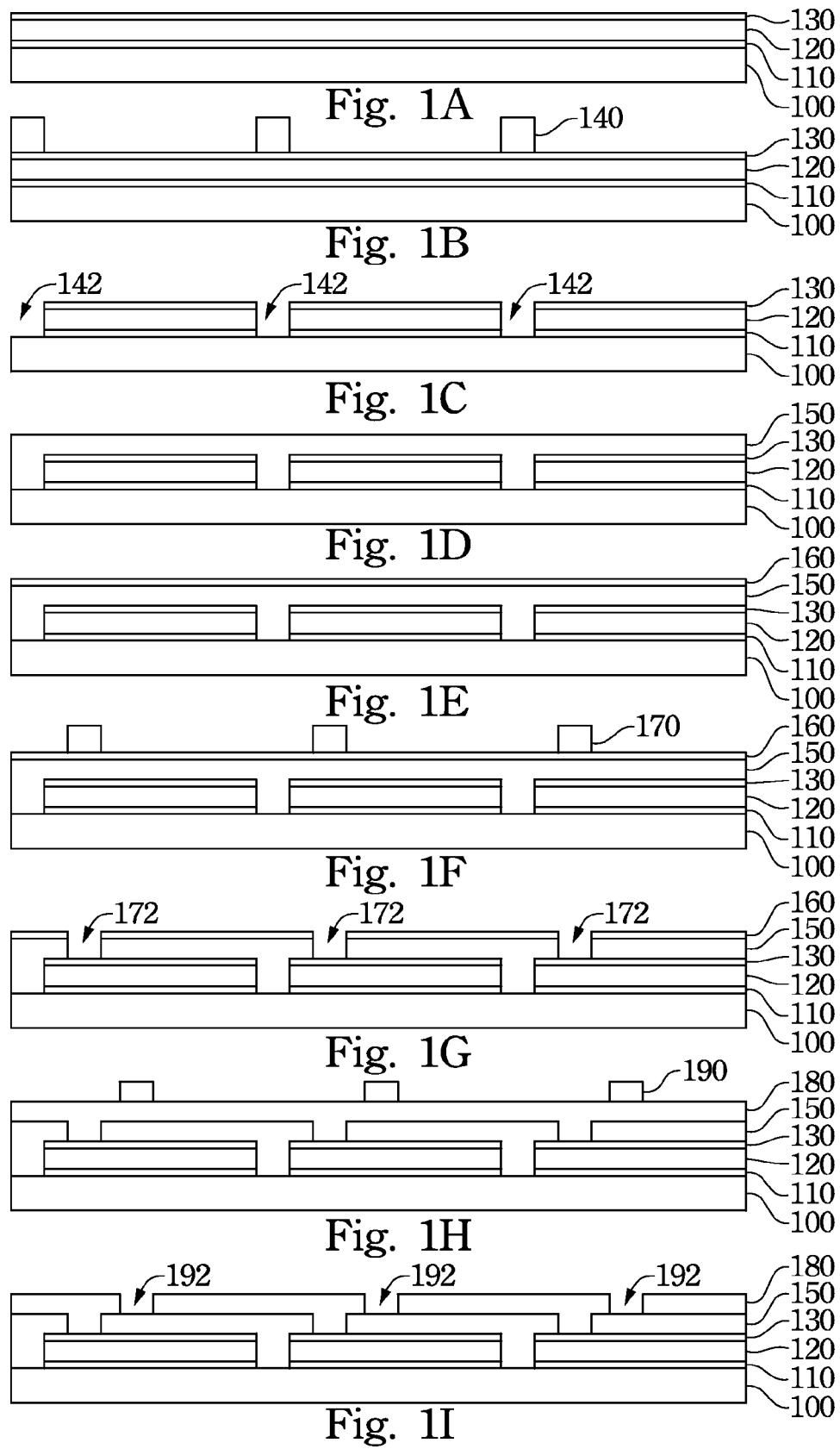

METHOD OF MAKING MONOLITHIC PHOTOVOLTAIC MODULE ON FLEXIBLE SUBSTRATE

RELATED APPLICATIONS

This application claims priority to U.S. Provisional Application Ser. No. 61/285,724, filed Dec. 11, 2009, which is herein incorporated by reference.

FIELD OF THE INVENTION

The present invention generally relates to a method of making a photovoltaic module. More particularly, this invention relates to a method of making a monolithic photovoltaic module on a flexible substrate.

BACKGROUND OF THE INVENTION

The increasing scarcity, and the realization of the ecological and safety problems associated with non-renewable energy resources such as coal, petroleum and uranium, have made it essential that increased use be made of alternate non-depletable energy resources such as solar energy. Solar energy use has been limited in the past to special applications due in part to the high cost of manufacturing devices capable of producing significant amounts of photovoltaic energy. The improvement in manufacturing technology for fabricating the solar panel in mass production has greatly promoted the use of solar energy.

Significant environmental benefits are also realized from solar energy production, for example, reduction in air pollution from burning fossil fuels, reduction in water and land use from power generation plants, and reduction in the storage of waste byproducts. Solar energy produces no noise, and has few moving components. Because of their reliability, solar panels also reduce the cost of residential and commercial power to consumers.

Laser scribing technology is widely used for the photovoltaic module fabrication because the laser-based machining tools can provide an ideal solution for many of the complex processes required in the manufacture of the photovoltaic modules. Therefore, the laser scribing technology can accurately pattern the thin films of the photovoltaic module with the desired patterns. However, one of the difficulties of making monolithic solar cells on a polymeric substrate is that the laser scribing of patterns normally generates too much heat and degrades the substrate. In particular, the laser scribing of a P1 pattern, close to the polymeric substrate, may cause a serious problem since the pattern is directly on top of the polymeric substrate.

SUMMARY OF THE INVENTION

One objective of the present invention is to provide a method of making a monolithic photovoltaic module on a flexible substrate.

To achieve these and other advantages and in accordance with the objective of the present invention, as the embodiment broadly describes herein, the present invention provides a method of making a monolithic photovoltaic module with a flexible substrate. The method includes the following steps:

providing a flexible substrate;
forming a first adhesive layer on the flexible substrate;
forming a metal layer on the first adhesive layer;
forming a second adhesive layer on the metal layer; and
etching through the second adhesive layer, the metal layer and the first adhesive layer with at least one etching paste.

The flexible substrate is a polymeric substrate, which can be transparent material such as PEN (Poly ethylene naphthalate) or PET (Poly ethylene terephthalate) or can be partially transparent material, for example, a polyimide substrate. The first adhesive layer can be a conducting layer or an insulating layer. In addition, the first adhesive layer can be an opaque layer or a transparent layer. While the first adhesive layer is transparent, a transparent conducting oxide layer selected from an Indium Tin Oxide (ITO) layer, a Zinc Oxide (ZnO) layer, an Indium Zinc Oxide (IZO) layer and an Aluminum Zinc Oxide (AZO) layer is preferably utilized.

Further, the second adhesive layer is a transparent conducting oxide layer, for example, an Indium Tin Oxide (ITO) layer, a Gallium Zinc Oxide (GZO) layer, an Indium Zinc Oxide (IZO) layer or an Aluminum Zinc Oxide (AZO) layer. The metal layer is made of silver.

The method further includes the following steps:

forming a semiconductor body layer on a patterned second adhesive layer and patterning the semiconductor body layer.

If the semiconductor body layer is patterned by an etching paste, or any other kind of wet etching process, a protecting layer is first formed on the semiconductor body layer and then the protecting layer and the semiconductor body layer is etched through by the etching paste. The semiconductor body layer can also be patterned by a lower power laser scribing to prevent from damage to the flexible substrate.

Furthermore, the semiconductor body layer is, for example, a silicon-based layer made of amorphous silicon, polycrystalline silicon or micro-crystalline silicon.

Moreover, the method can further include the following steps:

forming a transparent conducting oxide layer on a patterned semiconductor body layer; and
patterning the transparent conducting oxide layer to form transparent top electrodes.

The transparent conducting oxide layer can be patterned by an etching paste or a cold laser scribing.

Accordingly, the flexible substrate according to the present invention can effectively prevent from damage caused by the heat generating by the laser beam to pattern the metal layer. In addition, the present invention can further use the etching paste to further etch the semiconductor body with the protection layer and the transparent top electrode of the monolithic photovoltaic module so as to prevent from the heat damage to the flexible substrate.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 1A to FIG. 1I respectively illustrate sectional diagrams of the monolithic photovoltaic module corresponding to the steps of a method of making a monolithic photovoltaic module on a flexible substrate according to the present invention.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Refer to FIG. 1A to FIG. 1I. FIG. 1A to FIG. 1I respectively illustrate sectional diagrams of the monolithic photovoltaic module corresponding to the steps of a method of making a monolithic photovoltaic module on a flexible substrate according to the present invention. In FIG. 1A, a first metal oxide layer 110, a metal layer 120 and a second metal oxide layer 130 are subsequently formed on a flexible substrate 100. In addition, the first metal oxide layer 110 is served as a first adhesive layer to bind the metal layer 120 on the flexible substrate 100. The first metal oxide layer 110 can be a transparent conducing oxide (TCO) layer, for example, an Indium Tin Oxide (ITO) layer, a Zinc Oxide (ZnO) layer, an Indium Zinc Oxide (IZO) layer or an Aluminum Zinc Oxide (AZO) layer. However, the first adhesive layer can be a transparent layer, an opaque layer, a conducting layer or an insulating layer without departing from the spirit and scope of the present invention.

The metal layer 120 can be made of silver or any other metal material having good electronic conductivity. The second metal oxide layer 130 is also served as a second adhesive layer to bind a silicon-based layer 150 on the metal layer 120. Moreover, the second metal oxide layer 130 is also capable of conductivity, which can be a transparent conducing oxide (TCO) layer, for example, an Indium Tin Oxide (ITO) layer, a Gallium Zinc Oxide (GZO) layer, an Indium Zinc Oxide (IZO) layer or an Aluminum Zinc Oxide (AZO) layer. The flexible substrate 100 can be a polymeric substrate. In detail, the polymeric substrate can be transparent material, such as PEN (Poly ethylene naphthalate) or PET (Poly ethylene terephthalate). Alternatively, the polymeric substrate can be partially transparent material, such as polyimide substrate.

In FIG. 1B, an etching paste 140 is formed on the second metal oxide layer 130 by screen printing. Subsequently, the substrate 100 and the thin films are heated to define openings 142 thereon, in FIG. 1C. It is worth noting that the etching paste 140 can etch through the first metal oxide layer 110, the metal layer 120 and the second metal oxide layer 130 at once time. Alternatively, the first metal oxide layer 110, the metal layer 120 and the second metal oxide layer 130 can be etched by more than one etch paste without departing from the spirit and scope of the present invention.

Further refer to FIG. 1D. A silicon-based layer 150 is formed on the patterned second metal oxide layer 130, and a first transparent conducting oxide (TCO) layer 160 is formed thereon, in FIG. 1E. The first transparent conducting oxide layer 160 is a protection layer to protect the silicon-based layer 150 while etching the silicon-based layer 150 with the etching paste 170 in FIG. 1F and FIG. 1G. After etching through the first transparent conducting oxide layer 160 and the silicon-based layer 150, a plurality of openings 172 are defined in the first transparent conducting oxide layer 160 and the silicon-based layer 150. Since the first transparent conducting oxide layer 160 can effectively protect the silicon-based layer 150, the silicon-based layer 150 can effectively reduce the damage caused by the solvent or the cleaning water to wash the etching paste on the flexible substrate 100. Alternatively, the silicon-based layer 150 without the first transparent conducting oxide layer 160 can be patterned with low power laser scribing to prevent from heat damage to the flexible substrate 100. The silicon-based layer 150 is a semiconductor body layer made of amorphous silicon, polycrystalline silicon or micro-crystalline silicon. In one embodiment, the silicon-based layer 150 can be also other thin film PV materials, such as CIGS or CdTe, according to the demands.

Afterward, a second transparent conducting oxide (TCO) layer 180 is formed thereon in FIG. 1H. Subsequently, the openings 192 are defined in the second transparent conducting oxide (TCO) layer 180 with a desired etching paste 190 to form the transparent top electrodes. Alternatively, the openings 192 can be defined in the second transparent conducting oxide (TCO) layer 180 with a cold laser whose wavelength is preferably lower than 300 nanometer (nm) to form the transparent top electrodes according to the demands since the second transparent conducting oxide layer 180 is further away from the flexible substrate 100.

Accordingly, the flexible substrate according to the present invention can effectively prevent from damage caused by the heat generating by the laser beam to pattern the metal layer. In addition, the present invention can further use the etching paste to further etch the semiconductor body with the protection layer and the transparent top electrode layer of the monolithic photovoltaic module so as to prevent from a heat damage to the flexible substrate. The etching paste for etching the thin films of the monolithic photovoltaic module according to the present invention can be a desired commercial etching paste such as the isishape™ products manufactured by MERCK, Germany.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A method of making a monolithic photovoltaic module, comprising:
    providing a flexible substrate;
    forming a first adhesive layer on the flexible substrate;
    forming a metal layer on the first adhesive layer;
    forming a second adhesive layer on the metal layer;
    etching through the second adhesive layer, the metal layer and the first adhesive layer with at least one etching paste to form a patterned second adhesive layer;
    forming a semiconductor body layer on the patterned second adhesive layer; and
    patterning the semiconductor body layer.

2. The method of making a monolithic photovoltaic module of claim 1, wherein the flexible substrate is a polymeric substrate.

3. The method of making a monolithic photovoltaic module of claim 2, wherein the polymeric substrate is a polyimide substrate.

4. The method of making a monolithic photovoltaic module of claim 1, wherein the first adhesive layer is a conducting layer.

5. The method of making a monolithic photovoltaic module of claim 1, wherein the first adhesive layer is an opaque layer.

6. The method of making a monolithic photovoltaic module of claim 1, wherein the first adhesive layer is a transparent layer.

7. The method of making a monolithic photovoltaic module of claim 6, wherein the transparent layer is a transparent conducing oxide layer.

8. The method of making a monolithic photovoltaic module of claim 7, wherein the transparent conducing oxide layer is selected from an Indium Tin Oxide (ITO) layer, a Zinc Oxide (ZnO) layer, an Indium Zinc Oxide (IZO) layer and an Aluminum Zinc Oxide (AZO) layer.

9. The method of making a monolithic photovoltaic module of claim 1, wherein the second adhesive layer is a transparent conducing oxide layer.

10. The method of making a monolithic photovoltaic module of claim 9, wherein the transparent conducing oxide layer is selected from an Indium Tin Oxide (ITO) layer, a Zinc Oxide (ZnO) layer, an Indium Zinc Oxide (IZO) layer and an Aluminum Zinc Oxide (AZO) layer.

11. The method of making a monolithic photovoltaic module of claim 1, wherein the metal layer is made of silver.

12. The method of making a monolithic photovoltaic module of claim 1, further comprising:
    forming a protecting layer on the semiconductor body layer; and
    etching through the protecting layer and the semiconductor body layer to pattern the semiconductor body layer by an etching paste.

13. The method of making a monolithic photovoltaic module of claim 1, wherein the semiconductor body layer is a silicon-based layer.

14. The method of making a monolithic photovoltaic module of claim 13, wherein the silicon-based layer is made of amorphous silicon, polycrystalline silicon or micro-crystalline silicon.

15. The method of making a monolithic photovoltaic module of claim 1, wherein the semiconductor body layer is patterned by a low power laser scribing.

16. The method of making a monolithic photovoltaic module of claim 1, further comprising:
    forming a transparent conducting oxide layer on the patterned semiconductor body layer; and
    patterning the transparent conducting oxide layer to form transparent top electrodes.

17. The method of making a monolithic photovoltaic module of claim 16, wherein the transparent conducting oxide layer is patterned by etching paste.

18. The method of making a monolithic photovoltaic module of claim 16, wherein the transparent conducting oxide layer is patterned by cold laser scribing.

\* \* \* \* \*